(12) United States Patent
Ishibashi et al.

(10) Patent No.: US 10,512,197 B2
(45) Date of Patent: Dec. 17, 2019

(54) ELECTRONIC PART HOUSING STRUCTURE

(71) Applicant: Mitsubishi Electric Corporation, Tokyo (JP)

(72) Inventors: Satoshi Ishibashi, Tokyo (JP); Yuji Kuramoto, Tokyo (JP); Toshio Watanabe, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 0 days.

(21) Appl. No.: 16/101,571

(22) Filed: Aug. 13, 2018

(65) Prior Publication Data

US 2019/0269031 A1 Aug. 29, 2019

(30) Foreign Application Priority Data

Feb. 23, 2018 (JP) ................................. 2018-030339

(51) Int. Cl.
*H05K 7/20* (2006.01)
*H02K 5/20* (2006.01)
(Continued)

(52) U.S. Cl.
CPC ............ *H05K 7/2089* (2013.01); *H02K 5/20* (2013.01); *H05K 5/06* (2013.01); *H05K 7/20263* (2013.01); *H01L 23/473* (2013.01)

(58) Field of Classification Search
CPC ............ H01L 23/473; H01L 2924/181; G06K 19/06037; H05K 7/20927; H05K 7/20809; H05K 7/20254; H05K 1/14; H05K 7/20263; H05K 7/20; H05K 7/20281; H05K 7/20509; H02K 9/19; H02K 5/20; H02K 11/33; H02K 3/24; H02K 1/20
See application file for complete search history.

(56) References Cited

U.S. PATENT DOCUMENTS

| | | | |
|---|---|---|---|
| 6,588,647 B2 * | 7/2003 | Yamada | H05K 7/20872 165/170 |
| 6,911,598 B2 * | 6/2005 | Onizuka | H05K 7/026 174/50 |

(Continued)

FOREIGN PATENT DOCUMENTS

| | | |
|---|---|---|
| JP | 2005-033140 A | 2/2005 |
| JP | 4365338 B2 | 11/2009 |

(Continued)

*Primary Examiner* — Adam B Dravininkas
(74) *Attorney, Agent, or Firm* — Sughrue Mion, PLLC; Richard C. Turner

(57) ABSTRACT

A power converting device includes a heat sink including a heat sink base portion on an upper face side of which a depressed portion forming a refrigerant channel is provided and a heat sink upper plate covering the depressed portion of the heat sink base portion, wherein the refrigerant channel is sealed using a channel seal provided in an outer peripheral portion of the heat sink upper plate, an upper case caused to cover an upper face side of the heat sink, a lower case caused to cover a lower face side of the heat sink, and a terminal block forming a waterproofing wall that encloses a power module projecting from an upper face of the heat sink upper plate between the power module on the heat sink upper plate and the channel seal in the upper case.

16 Claims, 9 Drawing Sheets

(51) Int. Cl.
H05K 5/06 (2006.01)
H01L 23/473 (2006.01)

(56) References Cited

U.S. PATENT DOCUMENTS

| | | | | |
|---|---|---|---|---|
| 8,053,668 B2* | 11/2011 | Lai | ........................ | H05K 9/0009 |
| | | | | 174/17 R |
| 9,332,676 B2* | 5/2016 | Sharaf | ................ | H05K 7/20272 |
| 2001/0014029 A1* | 8/2001 | Suzuki | .................. | H02M 7/003 |
| | | | | 363/141 |
| 2005/0253465 A1* | 11/2005 | Takenaka | .................. | H02K 5/20 |
| | | | | 310/52 |
| 2006/0207780 A1* | 9/2006 | Shinmura | .......... | H05K 7/20927 |
| | | | | 174/50 |
| 2007/0041160 A1* | 2/2007 | Kehret | ............... | H05K 7/20254 |
| | | | | 361/704 |
| 2008/0236805 A1* | 10/2008 | Miki | ....................... | F28F 3/083 |
| | | | | 165/185 |
| 2011/0304039 A1* | 12/2011 | Miyamoto | .......... | H01L 23/4006 |
| | | | | 257/712 |
| 2013/0051108 A1* | 2/2013 | Nagao | ................ | H05K 7/20927 |
| | | | | 363/141 |

FOREIGN PATENT DOCUMENTS

| | | |
|---|---|---|
| JP | 2014-035071 A | 2/2014 |
| JP | 5508639 B2 | 6/2014 |

* cited by examiner

ELECTRONIC PART HOUSING STRUCTURE

BACKGROUND OF THE INVENTION

1. Field of the Invention

The present application relates to an electronic part housing structure formed to include a refrigerant channel.

2. Description of the Related Art

As one example of an electronic part housing structure, there is a vehicle-mounted power converting device.

In an existing power converting device, a heat sink is used for cooling electronic parts arrayed inside a case. Further, there is a case in which a refrigerant flowing along a refrigerant channel of the heat sink leaks out into an interior of the case in which the electronic parts are housed in accompaniment to a defect in a sealing mechanism of the refrigerant channel.

Also, technology such that a power supply control device is mounted on a transmission, and electronic parts are disposed on an upper face and a lower face of a heat sink, has been disclosed as an example of a power supply control device including a power converting device (for example, refer to Patent Document 1).

Furthermore, technology that provides two housing chambers housing electronic parts formed by two housings being combined, and a refrigerant channel formed by sealing a gap between the housing chambers with a sealing member, has been disclosed (for example, refer to Patent Document 2).

Also, technology that provides a groove for discharging a refrigerant that has leaked out inside a case has been disclosed (for example, refer to Patent Documents 3 and 4).

Patent Document 1: Japanese Patent No. 5,508,639
Patent Document 2: Japanese Patent No. 4,365,338
Patent Document 3: JP-A-2014-35071
Patent Document 4: JP-A-2005-33140

An existing electronic part housing structure including a refrigerant channel is such that a measure for improving a sealing function, such as providing a sealing member that seals a refrigerant channel over a large width (including a case of adopting a double seal structure), is needed in order that a refrigerant does not leak out inside a case housing the electronic parts. However, a mounting area for seal member disposition equivalent to the large width of the seal member is needed, which may lead to an increase in size of a device.

Also, when a defect occurs in the refrigerant channel sealing function, the refrigerant leaks into an interior of the case, and when the refrigerant is cooling water, an electronic part to which a high voltage is applied becomes covered with water, which may lead to a short circuit.

SUMMARY OF THE INVENTION

The present application has been made to solve the problem and an object of the present application is to provide an electronic part housing structure having a waterproofing structure that can prevent a short-circuit of a high voltage unit, even when a leak of a refrigerant inside a case occurs, with no accompanying increase in size of an electrical device in which an electronic part is mounted.

An electronic part housing structure disclosed in the application includes a heat sink including a heat sink base portion on an upper face side of which a depressed portion forming a refrigerant channel is provided and a heat sink upper plate caused to cover the depressed portion of the heat sink base portion, wherein the refrigerant channel is sealed using a seal portion provided in an outer peripheral portion of the heat sink upper plate, an upper case caused to cover an upper face side of the heat sink, an electronic part mounted on an upper face of the heat sink upper plate, and a waterproofing wall provided between the electronic part and the seal portion in an internal space of the upper case and protruding from the upper face of the heat sink upper plate so as to enclose the electronic part.

The electronic part housing structure disclosed in the application can prevent an electronic part mounted on an upper face of a heat sink upper plate and to which a high voltage is applied from being covered with water by a waterproofing wall being provided inward of a seal portion of a refrigerant channel, without a mounting area being increased.

The foregoing and other objects, features, aspects, and advantages of the application will become more apparent from the following detailed description of the application when taken in conjunction with the accompanying drawings.

DETAILED DESCRIPTION OF THE PREFERRED EMBODIMENTS

First Embodiment

Figure 1:
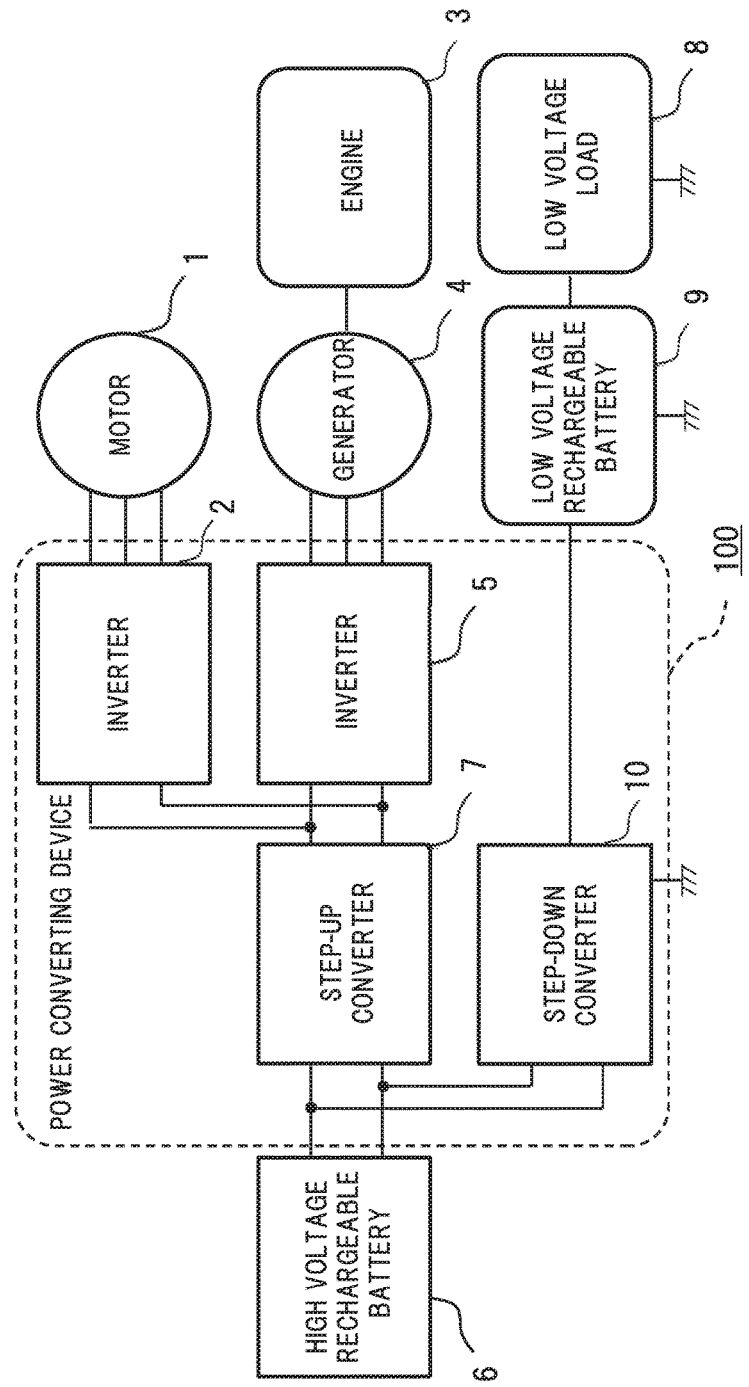
FIG. 1 is a configuration diagram of an electrical device incorporating a power converting device corresponding to an electronic part housing structure according to the first embodiment.

An electronic part housing structure according to the first embodiment will be described, using FIGS. 1 to 8. The electronic part housing structure is used as, for example, a vehicle-use power converting device 100. FIG. 1 is a configuration diagram of an electrical device incorporating the vehicle-use power converting device 100 corresponding to the electronic part housing structure according to the first embodiment. For example, a low voltage electronic part to which a comparatively low voltage is applied, such as a current sensor, and a high voltage part to which a higher voltage is applied, are mounted in the same device in the power converting device 100.

In FIG. 1, the power converting device 100 includes a first inverter 2 that controls a vehicle-drive motor 1, a second inverter 5 that controls a generator 4 connected to an engine 3, a step-up converter 7 that steps up a voltage of a high voltage rechargeable battery 6, and a step-down converter 10 that steps down the voltage of the high voltage rechargeable battery 6, insulates, and supplies power to a low voltage rechargeable battery 9 used in a low voltage load 8.

The power converting device 100 is such that, for example, the vehicle-drive motor 1 is of in the region of 50 to 200 kW, the generator 4 connected to the engine 3 is of in the region of 50 to 150 kW, the high voltage rechargeable battery 6 is of in the region of 100 to 400 V, and the rechargeable battery 9 used in the low voltage load 8 is of in the region of 12 to 48 V, and these are used in combination.

In this case, for example, the power converting device 100 is used in an electric vehicle such as a two motor type of hybrid electric automobile or a plug-in type of hybrid electric automobile.

Applications and configurations of the power converting device 100 are not limited to the details described here, and it goes without saying that one portion of functions can be extracted and used by transferring to another method.

Figure 2:
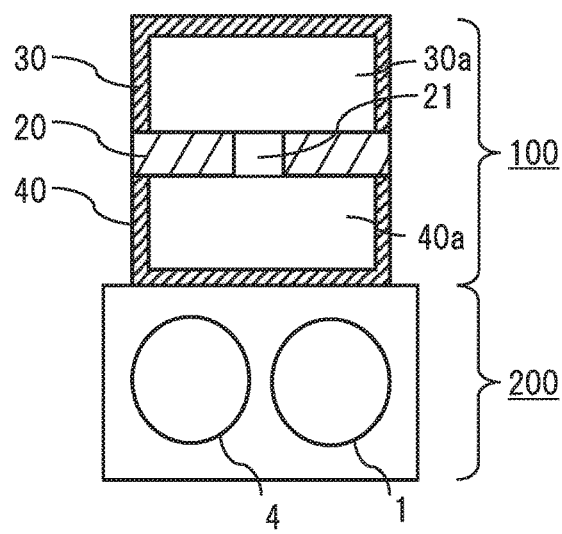
FIG. 2 is a main portion sectional side view of the power converting device configuring the electrical device of FIG. 1 and a drive device.

FIG. 2 is a main portion sectional view of the power converting device 100 configuring the electrical device of FIG. 1 and a drive device 200, wherein the power converting device 100 is configured to include a lower case 40 supported by the drive device 200, which is a transmission or the like, a heat sink 20 supported by the lower case 40, and an upper case 30 supported by the heat sink 20. Further, the heat sink 20 has a linking hole portion 21 that connects an internal space 30a of the upper case 30 and an internal space 40a of the lower case 40.

Figure 3:
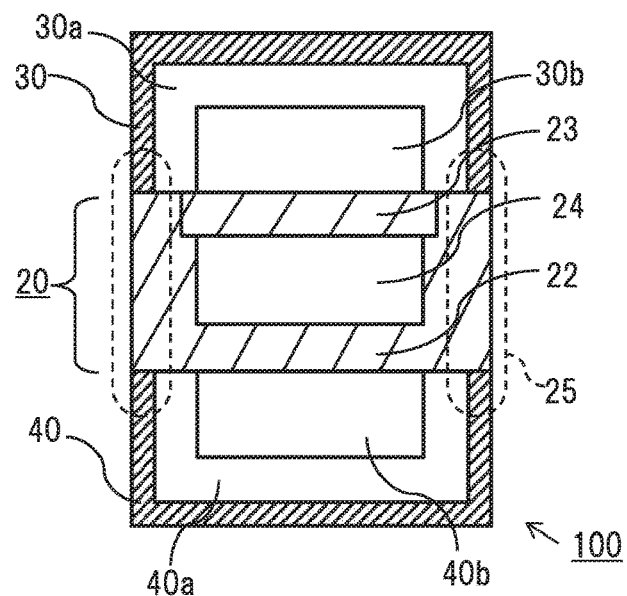
FIG. 3 is a main portion sectional view of the power converting device of FIG. 2.

FIG. 3 is a main portion sectional view of the power converting device 100, and shows a cross-section differing from that of FIG. 2. As shown in FIG. 3, the heat sink 20 is such that a refrigerant channel 24 along which cooling water flows is provided in an interior, and the heat sink 20 is configured to include a heat sink base portion 22 in which a depressed portion forming the refrigerant channel 24 is provided, and a heat sink upper plate 23 placed on the refrigerant channel 24 so as to close off the depressed portion. An outer peripheral portion of the heat sink 20 forms a case fastening portion 25 fastened to the upper case 30 and the lower case 40.

A heat generating element 30b mounted on an upper side of the heat sink 20 is joined directly to an upper face (upper side heat dissipating portion) of the heat sink upper plate 23, which forms a mounting face of the heat generating element 30b, and dissipates heat to the heat sink upper plate 23, and a heat generating element 40b mounted on a lower side of the heat sink 20 is joined directly to a bottom face (lower side heat dissipating portion) of the heat sink base portion 22, which forms a mounting face of the heat generating element 40b, and is configured so as to dissipate heat to the heat sink base portion 22.

Next, an internal configuration of the power converting device 100 will be described in more detail.

Figure 4:
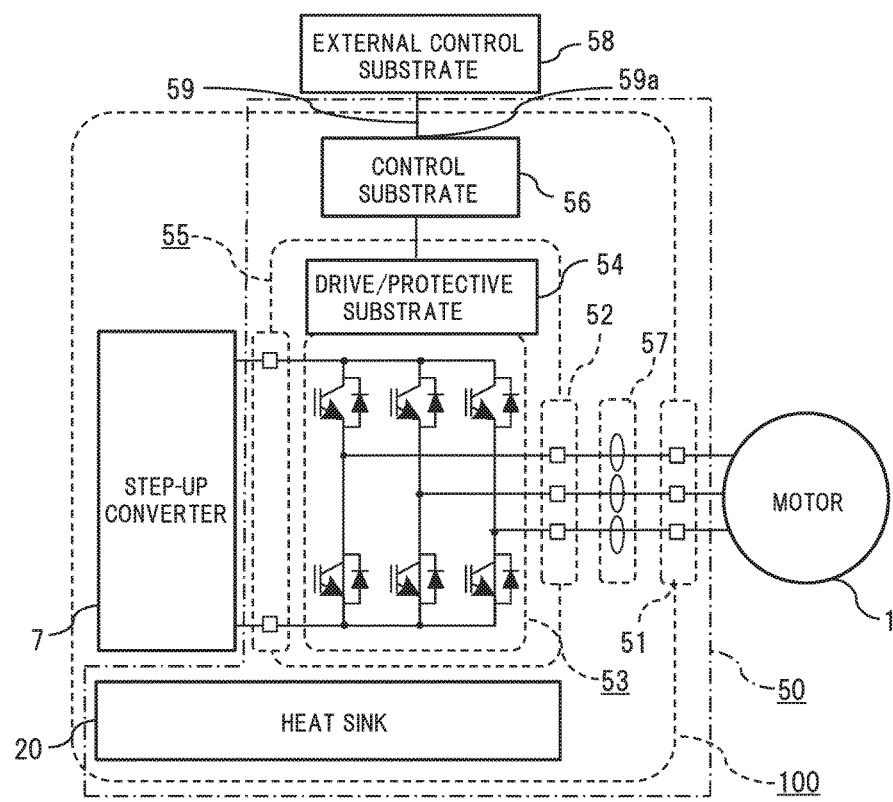
FIG. 4 is a configuration diagram of the power converting device according to the first embodiment.

The first inverter 2 and the second inverter 5 shown in FIG. 1 are of the same configuration as an inverter 50 included in a configuration diagram of the power converting device 100 shown in FIG. 4.

As shown in FIG. 4, the inverter 50 is configured to include a three-phase output terminal 51 connected to the motor 1 (or the generator 4), an intelligent power module (IPM) 55 having a terminal block 52, a power module 53, and a drive/protective substrate 54, the heat sink 20, which cools the IPM 55, a control substrate 56 that controls a switching timing of the IPM 55, and a three-phase current sensor 57 that detects a three-phase output current.

An external control substrate 58 is connected via a control harness 59 to the control substrate 56, and a control signal connector 59a is provided on a leading end portion of the control harness 59. Also, the control harness 59 is also used in connecting the control substrate 56 and the drive/protective substrate 54.

Herein, the terminal block 52 is of a configuration corresponding to a waterproofing wall for preventing immersion in water, provided so that a water leak occurring due to a sealing function defect such that sealing (a channel seal 26) of the refrigerant channel 24 partially breaks does not infiltrate the internal space 30a of the upper case 30 on the power module 53 side. A specific configuration of the terminal block 52 forming the waterproofing wall will be described hereafter.

Figure 5:
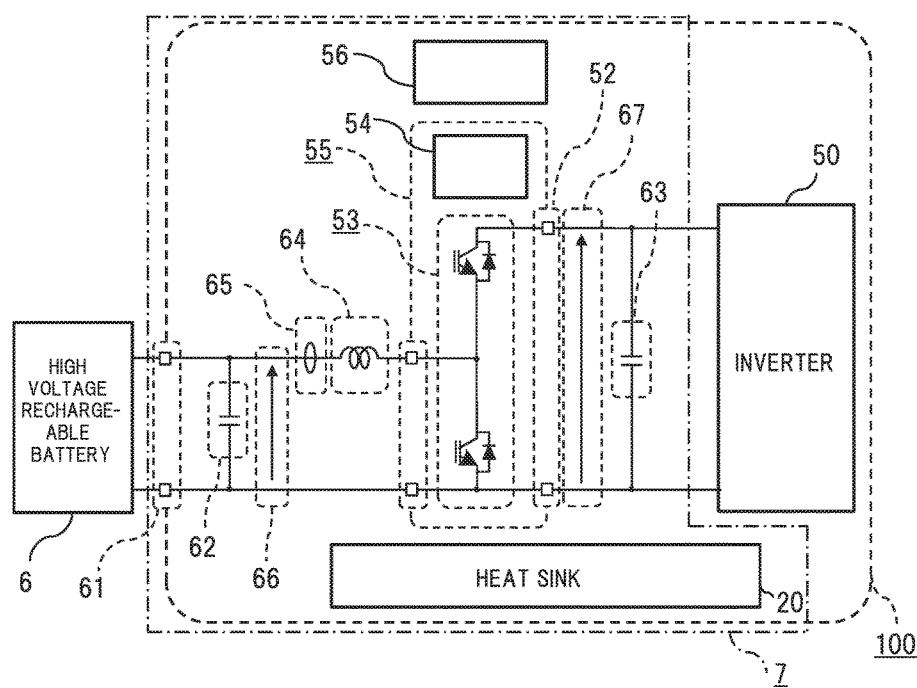
FIG. 5 is a configuration diagram of the power converting device according to the first embodiment.

FIG. 5 is a configuration diagram of the power converting device 100, and is a diagram that has the step-up converter 7 as a main portion. As shown in FIG. 5, the step-up converter 7 is configured to include a direct current input terminal 61 connected to the high voltage rechargeable battery 6, a primary side smoothing capacitor 62 connected to the direct current input terminal 61, a secondary side smoothing capacitor 63 connected to the inverter 50, a reactor 64 used in stepping up, the IPM 55 having the terminal block 52, the power module 53, and the drive/protective substrate 54, the heat sink 20, which cools the IPM 55 and the reactor 64, the control substrate 56 that controls the switching timing of the IPM 55, a reactor current sensor 65 that detects a current of the reactor 64, a primary side voltage sensor 66 that detects a voltage of the primary side smoothing capacitor 62, and a secondary side voltage sensor 67 that detects a voltage of the secondary side smoothing capacitor 63.

Figure 6:
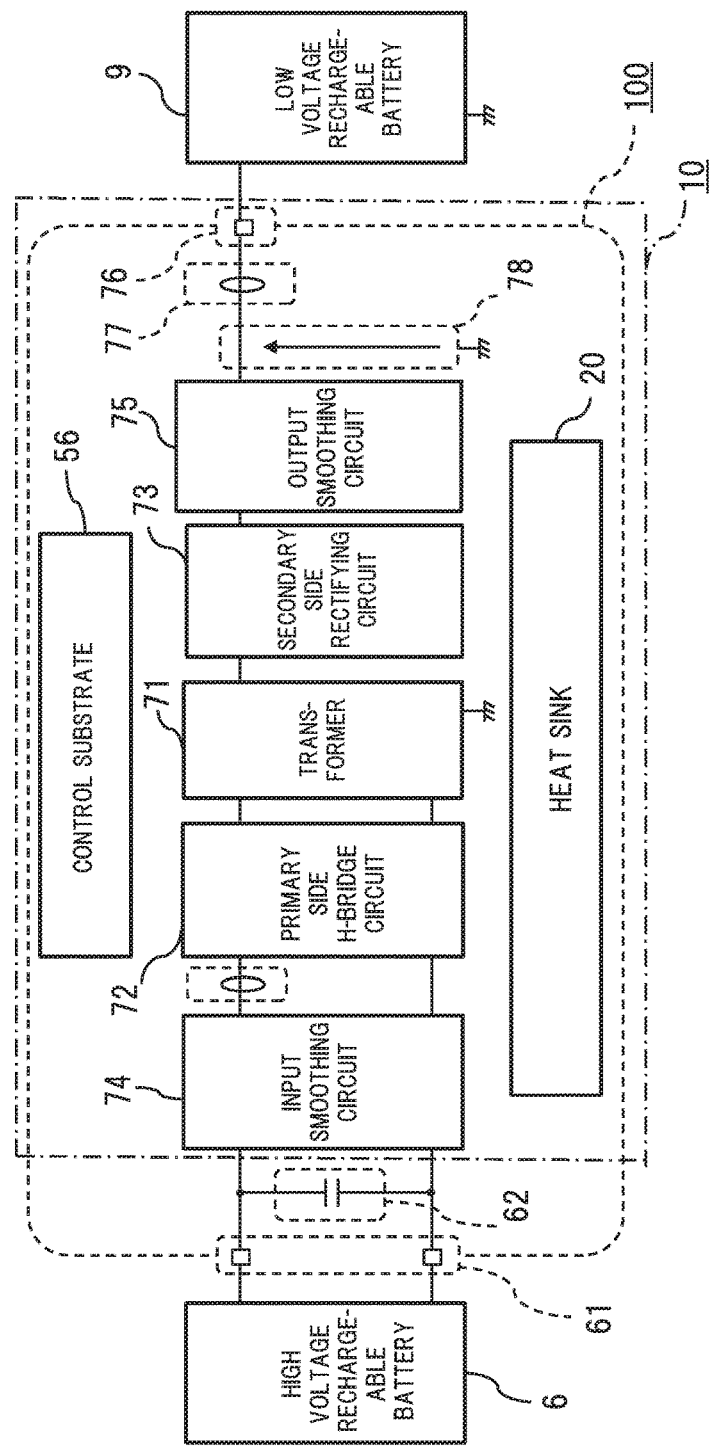
FIG. 6 is a configuration diagram of the power converting device according to the first embodiment.

FIG. 6 is a configuration diagram of the power converting device 100, and is a diagram that has the step-down converter 10 as a main portion. As shown in FIG. 6, the step-down converter 10 is configured to include a primary side H-bridge circuit 72 that supplies alternating current power to a transformer 71, the transformer 71, which carries out stepping down and insulation, a secondary side rectifying circuit 73 that rectifies an alternating current output of the transformer 71, an input smoothing circuit 74 that smooths an input, an output smoothing circuit 75 that smooths an output, an auxiliary engine power supply output terminal 76 connected to the low voltage rechargeable battery 9 used in the low voltage load 8, the heat sink 20, which cools the primary side H-bridge circuit 72, the secondary side rectifying circuit 73, and the like, the control substrate 56, which controls the switching timing of the primary side H-bridge circuit 72, a current sensor 77 that detects an input current or an output current, and a voltage sensor 78 that detects an output voltage.

Figure 7:
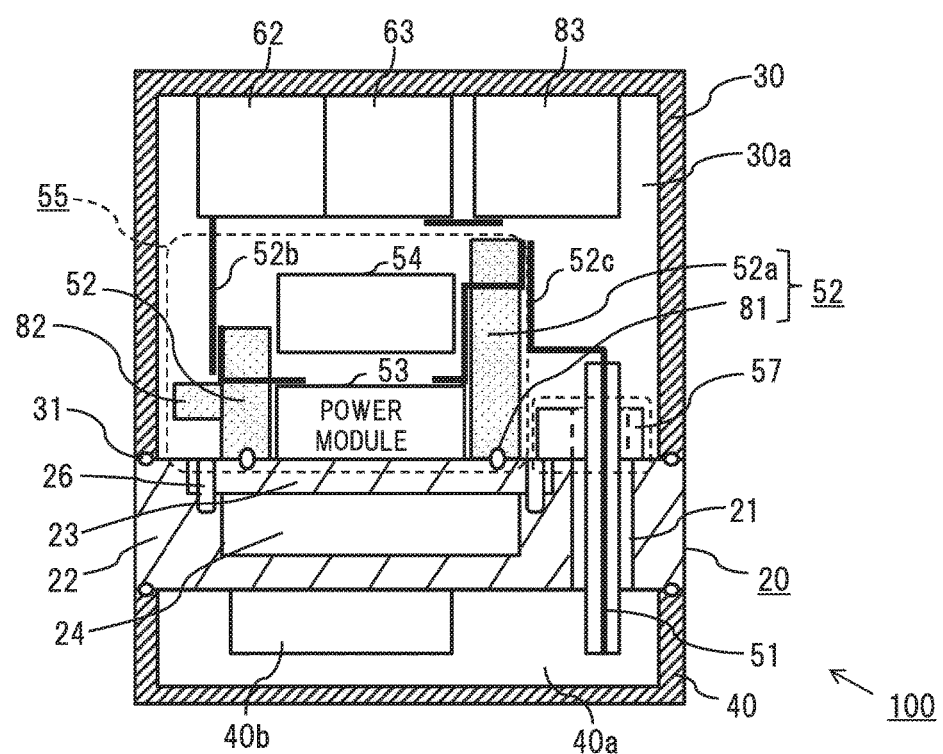
FIG. 7 is a main portion sectional view of the power converting device according to the first embodiment.

Next, FIG. 7 is a main portion sectional view of the power converting device 100 according to the first embodiment of the application, and illustrates in detail the terminal block 52 forming the waterproofing wall, and the like.

In the power converting device 100 of the first embodiment of the application, the structure of the heat sink 20 is such that the depressed portion forming the refrigerant channel 24 is provided in an upper face side, and the plate-form heat sink upper plate 23 is placed so as to close off the depressed portion. Further, a cutaway portion in which an insulating portion of the heat sink upper plate 23 is fitted is provided in a periphery of the depressed portion forming the refrigerant channel 24. The heat sink upper plate 23, in a state covering the depressed portion of the heat sink base portion 22, is joined to the heat sink base portion 22 by the channel seal 26 (corresponding to a seal portion) being formed in the cutaway portion in the periphery of the depressed portion, whereby the refrigerant channel 24 is formed.

Herein, an area of the heat sink upper plate 23 is configured to be smaller than that of the heat sink base portion 22, whereby a state is such that the heat sink upper plate 23 is fitted closely in the cutaway portion in the upper face side of the heat sink base portion 22, and upper faces of the heat sink base portion 22 and the heat sink upper plate 23 are configured so as to be flush, that is, so as to form a continuous flat face. Also, when necessary, a thickness of the heat sink upper plate 23 or a depth of the cutaway portion can be regulated, thereby obtaining a configuration such that the upper face of the heat sink 20 is stepped.

This structure is of a configuration such that, as the area of the heat sink upper plate 23 is smaller than that of the heat sink base portion 22, the channel seal 26 is provided on the upper face side of the heat sink 20, and when a sealing function defect of the channel seal 26 occurs, the cooling water leaks into the internal space 30a side of the upper case 30, but the leaking water does not leak out directly into the lower case 40 side.

Other than the heat sink upper plate 23 being disposed so as to fit into the cutaway portion of the heat sink base portion 22, as heretofore described, a state wherein the heat sink upper plate 23 and the heat sink base portion 22 are fitted together can be a configuration such that an end portion of the heat sink upper plate 23 is disposed so as to be superimposed on a portion that is the upper face of the heat sink base portion 22 and forms an outer peripheral portion of the refrigerant channel 24, with no cutaway portion being provided in the heat sink base portion 22, and rather than the upper faces of the two being flush, the upper face of the heat sink upper plate 23 is higher than the upper face of the heat sink base portion 22. The channel seal 26 is formed in a portion in which the heat sink upper plate 23 is superimposed on the heat sink base portion 22, or in a position of contact.

When sealing the refrigerant channel 24 by joining the heat sink base portion 22 and the heat sink upper plate 23, the channel seal 26 shown in FIG. 7 forms a joint portion, and welding such as friction stir molding (FSW) or electron beam welding is performed on the same portion.

The terminal block 52 forming the waterproofing wall is mainly configured of a wall face portion 52a enclosing the power module 53. Further, in order to seal a lower end of the wall face portion 52a and the upper face of the heat sink upper plate 23, a sealing member 81 (a sealing member forming power module high voltage portion sealing means) interposed between the two is included in a region between the power module 53 of the IPM 55 and the channel seal 26.

The sealing member 81 is provided by, for example, seamlessly applying a sealing material (for example, a material formed of a sealing resin), disposing a sealing member in an O form, or the like, between a lower end face of the wall face portion 52a of the terminal block 52 of the IPM 55 and the upper face of the heat sink 20.

Further, the terminal block 52 is provided above the sealing member 81 so as to be of a height that does not come into contact with an electronic part disposed in a ceiling portion of the internal space 30a, has no electrical effect, and does not interfere.

Also, regarding a thickness of the wall face portion 52a of the terminal block 52, provided that an inner face of the wall face portion 52a does not come into contact with the power module 53 and an outer face is disposed inward of the channel seal 26, a mounting area is not increased by the terminal block 52 being additionally provided, and the device does not increase in size.

Only a sectional portion of the wall face portion 52a of the terminal block 52 perpendicular to an electronic part mounting face is shown in FIG. 7, but a fastening portion, or the like, for fixing to the heat sink upper plate 23 extending along the mounting face from an unshown portion is provided, and the terminal block 52 is fixed to the heat sink 20 side.

Also, the wall face portion 52a of the terminal block 52 can be configured of, for example, an insulating material.

The terminal block 52 of the IPM 55 is such that a wiring portion 52b connecting the power module 53 to the primary side smoothing capacitor 62 and the secondary side smoothing capacitor 63 is also disposed in an outer face portion of the wall face portion 52a, and a waterproofing cave 82 (a water repelling portion) made of resin that protrudes outward from the outer face of the wall face portion 52a is provided below the wiring portion 52b.

A certain space is provided between the waterproofing cave 82 and the heat sink 20, and even when the vehicle-use power converting device 100 vibrates while traveling, cooling water infiltrating the internal space 30a from the channel seal 26 is accumulated in a space below the waterproofing cave 82, and water is restricted from entering an interior of the IPM 55 in which the power module 53 is disposed by the terminal block 52 forming the waterproofing wall and the waterproofing cave 82. It goes without saying that a size of the waterproofing eave 82 is of an extent such that there is no accompanying increase in size of the device.

Figure 8:
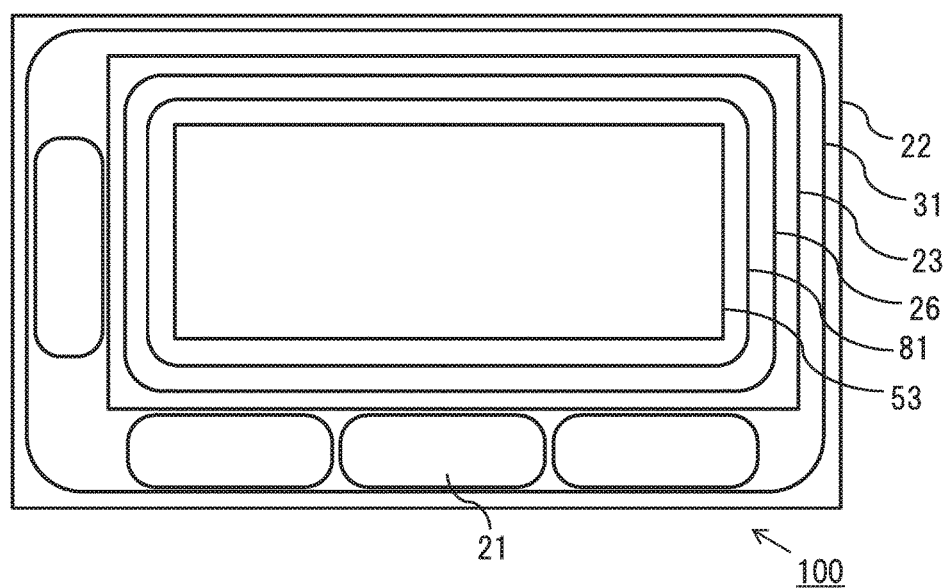
FIG. 8 is a top view of the power converting device from which an upper case of FIG. 7 has been removed.

Herein, FIG. 8 shows a top view of the power converting device 100 from which the upper case 30 of FIG. 7 has been removed. As in FIG. 8, the sealing member 81 disposed in a lower end portion of the terminal block 52 is provided in an O-form so as to enclose an outer periphery of the power module 53, and the channel seal 26 is provided on an outer side of the sealing member 81. Therefore, even when a defect of the channel seal 26 occurs, leaking water infiltrating on the power module 53 side can be prevented by the sealing member 81 and the wall face portion 52a above the sealing member 81.

Further, in the example of FIG. 8, an outer periphery of the heat sink upper plate 23 is shown in a state disposed farther to the outer side than the channel seal 26, but it goes without saying that provided that the channel seal 26 is in a position in which the refrigerant channel 24 can be sealed, the channel seal 26 can also be provided along an outer peripheral end portion of the heat sink upper plate 23.

Further, the wall face portion 52a configuring the waterproofing wall is provided above the sealing member 81 provided so that a flat form thereof is an O-form, as in FIG. 8, but when a height of the wall can be greater than a portion in which the waterproofing cave 82 is provided, and a conductive portion disposed in this portion can be provided to be higher than a height of the waterproofing cave 82, water can be prevented from entering the IPM 55 by a space of sufficient size being secured from the upper face of the heat sink upper plate 23 upward, without the waterproofing eave 82 being provided.

For example, as shown in the wall face portion 52a sectional portion positioned on a right side of FIG. 7, the wiring portion 52c connecting the power module 53 and the three-phase output terminal 51, of which one portion is sealed with resin, is disposed, for example, on an outer side face of the wall face portion 52a of the terminal block 52 provided protruding to the full disposition height of the IPM 55, but a configuration is such that a space sufficiently large that water entry can be prevented is secured between the wiring portion 52c and the upper face of the heat sink 20, without providing the waterproofing eave 82 forming a water repellent below the wiring portion 52c.

Furthermore, as shown in the example of FIG. 7, electronic parts to which a high voltage is applied, that is, the primary side smoothing capacitor 62, the secondary side smoothing capacitor 63, and a discharge resistor 83 that releases a charge of the smoothing capacitors, are disposed in the ceiling portion of the internal space 30a of the upper case 30 provided on the upper side of the heat sink 20. In order to prevent the high voltage electronic parts being covered in water, the electronic parts are disposed suspended in the internal space 30a so that a sufficient-height can he secured from the upper face of the heat sink 20.

Also, the IPM 55, to which a high voltage is applied, the primary side and secondary side voltage sensors (not shown), mounted on the drive/protective substrate 54 and to which a high voltage is applied, and the non-contact type three-phase current sensor 57 (not in contact with the three-phase output terminal 51, to which a high voltage is applied), are disposed on the upper side of the heat sink 20.

Herein, the current sensors including the three-phase current sensor 57, which are parts to which a comparatively low voltage is applied, can be used as failure detecting units that detect a water leak inside a case. As shown in FIG. 7, the three-phase current sensor 57 is disposed in a position lower than the waterproofing cave 82 forming the water repelling portion disposed in the internal space 30a, is disposed in proximity to the linking hole portion 21, that is, in contact with an upper end of the linking hole portion 21 or in a periphery of the upper end, and is covered in water before the high voltage parts disposed in the ceiling portion or the high voltage parts enclosed by the waterproofing wall when a water leak occurs. Therefore, by the current sensors being used as failure detecting sensors, the power converting device 100 can be provided with a failure detecting function, and when a failure such as a water leak occurs, the device can be promptly stopped on an output from a failure detecting sensor being received, whereby the device is operated more safely, and a protective function of the electrical device can be improved.

According to the electronic part housing structure of the first embodiment, the sealing member 81 forming the waterproofing wall is disposed between the channel seal 26 and the power module 53, and the terminal block 52 is provided by the wall face portion 52a being constructed above the sealing member 81, because of which water can be prevented from reaching a high voltage portion without changing the size of the electrical device itself. Further, as this kind of waterproofing measure is adopted, the channel seal 26 itself is a single structure, and a sealing method such as FSW or electron beam welding, whereby a width of the channel seal 26 becomes small at 3 mm or less, can be employed (in a case of a general brazing, the seal width is in the region of 6 mm). Therefore, a measure for improving sealing characteristics of the refrigerant channel 24, such as a seal width expansion or adopting a double seal, is unnecessary.

Also, the power converting device 100 can also be configured so that all of the electronic parts are disposed on the upper case 30 side, and the lower case 40 is not included, and it goes without saying that in this case too, the heretofore described waterproofing wall and the like can be applied.

Second Embodiment

In the first embodiment, a disposition of parts in the internal space 30a of the upper case 30 is described, mainly using FIG. 7, but in the second embodiment, a disposition of components in the internal space 40a of the lower case 40 will be described, using FIG. 9.

Figure 9:
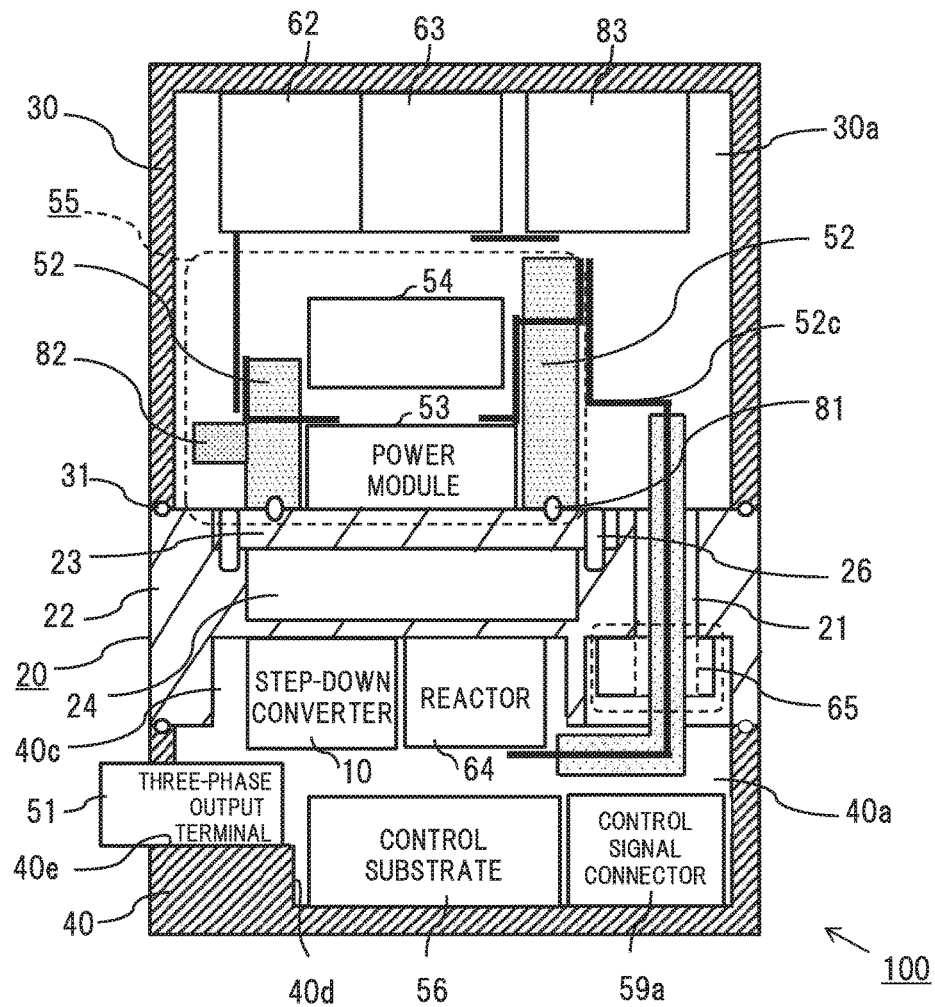
FIG. 9 is a main portion sectional view of the power converting device according to a second embodiment.

FIG. 9 is a main portion sectional view of the power converting device 100, wherein the reactor 64 and the step-down converter 10, to which a high voltage is applied, are disposed in a depressed portion 40c, that is, a ceiling portion of the internal space 40a, formed facing upward from a lower face side of the heat sink base portion 22 of the heat sink 20, and the reactor current sensor 65, which is a low voltage electronic part (an electronic part to which a high voltage is not applied) is disposed in proximity to the linking hole portion 21 in a depressed portion linked to a lower end of the linking hole portion 21, so as to be in contact with the lower end of the linking hole portion 21 or positioned in a periphery thereof.

The depressed portion 40c (the ceiling portion of the internal space 40a) of the heat sink base portion 22 linked to the internal space 40a of the lower case 40 can be formed of a step, and in order to avoid a short-circuit, high voltage parts such as the reactor 64 and the step-down converter 10 are disposed in the depressed portion 40c, which is the least likely place in the internal space 40a to be covered in water.

The reactor current sensor 65, which is one of the current sensors, is disposed in a position in the internal space 40a covered with water before the high voltage parts to which a high voltage is applied, nearer to the linking hole portion 21 than the high voltage parts or in contact with the linking hole portion 21, and a failure detecting function can be obtained by using this current sensor as a failure detecting sensor, whereby the power converting device 100 can be operated safely, and functions can be stopped promptly when there is a water leak.

Also, as shown in FIG. 9, the direct current input terminal (not shown) and the three-phase output terminal 51, to which a high voltage is applied, and the control substrate 56 and the control signal connector 59a, which are low voltage electronic parts to which a high voltage is not applied, are disposed in the lower case 40 provided on the lower side of the heat sink 20.

The lower case 40 has a stepped portion forming a depressed portion 40d in a bottom face portion of the internal space 40a, and low voltage parts such as the control substrate 56 and the control signal connector 59a are disposed in the depressed portion 40d.

Also, the lower case 40 includes a stepped portion 40e in a position one step higher than the depressed portion 40d forming the bottom face portion of the internal space 40a. The stepped portion 40e is provided in a position distanced from the linking hole portion 21, and the three-phase output terminal 51 or the direct current input terminal (not shown) is disposed in the stepped portion 40e.

Owing to the components being disposed in the internal space 40a in this way, leaking water firstly flows into the linking hole portion 21, and the reactor current sensor 65 is covered in water, when there is a sealing function defect or the like. Furthermore, the configuration is such that as low voltage parts such as the control substrate 56 and the control signal connector 59a are disposed nearer to the linking hole portion 21 and lower than high voltage parts (for example, the step-down converter 10 and the reactor 64), the low voltage parts are covered with water before the high voltage parts.

In this way, the power converting device 100 of the second embodiment of the application has a failure detecting function of detecting a failure by a low voltage electronic part such as the reactor current sensor 65 being covered with water, because of which the power converting device 100 can be safely stopped before a high voltage electronic part, to which a voltage higher than that applied to the low voltage electronic part is applied, is covered with water.

Therefore, the power converting device 100 with a higher degree of safety can be obtained.

Third Embodiment

In the third embodiment, using a main portion sectional view of the power converting device 100 in FIG. 10, a description will be given of preventing a deterioration of the sealing force of the channel seal 26 by increasing a number of places in which the heat sink base portion 22 and the heat sink upper plate 23 of the heat sink 20 are fastened, and also providing a fastening place in the refrigerant channel 24, thereby restricting vibration acting on the channel seal 26.

Figure 10:
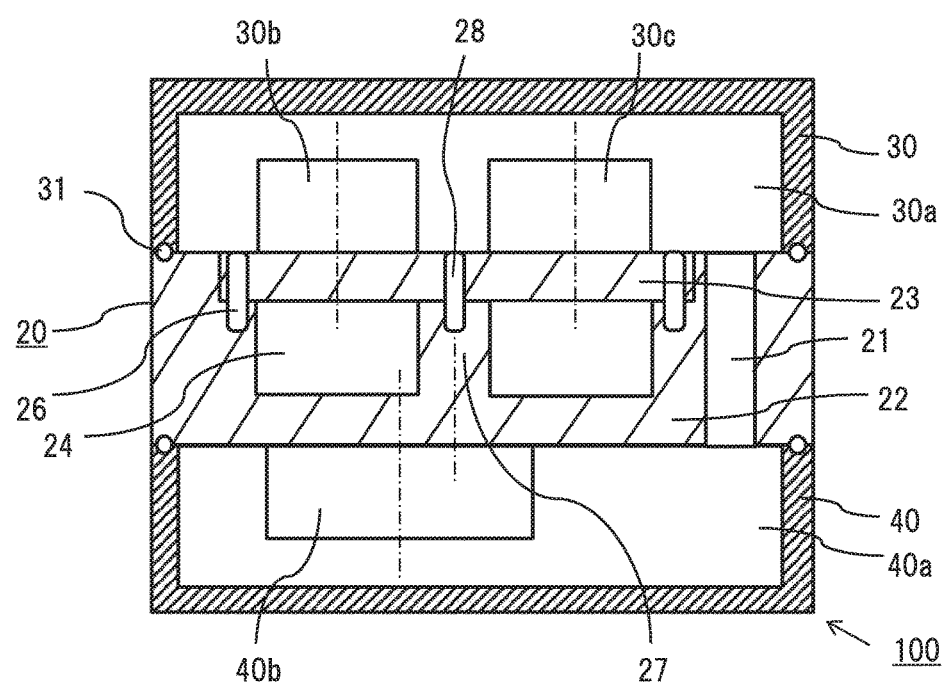
FIG. 10 a main portion sectional view of the power converting device according to a third embodiment.

As shown in FIG. 10, the heat sink 20 according to the third embodiment is of a configuration such that a columnar body 27 of a form protruding from a bottom face of a depressed portion of the heat sink base portion 22 and reaching a back face of the heat sink upper plate 23 is provided in an approximately central portion of the refrigerant channel 24, and the heat sink upper plate 23 and the columnar body 27 of the heat sink base portion 22 are fastened by a vertical fastening portion 28. In the example of FIG. 10, the columnar body 27 is formed so as to protrude from the bottom face of the depressed portion of the heat sink base portion 22, so as to be of a height lower by an amount equivalent to the thickness of the heat sink upper plate 23 than the upper face of the heat sink base portion 22 (a height the same as that of a bottom face of the cutaway portion.)

By the columnar body 27 and the vertical fastening portion 28 being additionally provided in the power converting device 100 of the first and second embodiments, vertical fastening strength of the components of the heat sink 20 can be increased.

Even in a case in which parts such as the heat generating elements 30b and 30c mounted on the heat sink upper plate 23 are subjected to vibration, the vibration can be efficiently prevented from being transmitted to the channel seal 26 fixing the heat sink upper plate 23 and the heat sink base portion 22 by the columnar body 27 being disposed in the central portion of the refrigerant channel 24, whereby vibration resistance can be increased. Also, pressure resistance of the refrigerant channel 24 can also be increased, and even when refrigerant pressure rises, this can be prevented from leading to a sealing function defect, and a state wherein the refrigerant, channel 24 is sealed by the channel seal 26 can be stably maintained.

The vertical fastening portion 28 can be obtained by the heat sink upper plate 23 and the columnar body 27 protruding from the heat sink base portion 22 being joined by a welding such as FSW or electron beam welding.

A multiple of the columnar body 27 can be disposed distanced from each other in the refrigerant channel 24 of one power converting device 100, and with consideration to heat diffusion efficiency, the columnar bodies 27 can also be disposed in positions distanced from a central portion of each heat generating element.

For example, when there is differing reliability of joints between the heat generating elements 30b, 30c, and 40b and the heat sink 20, positions can be regulated so that the central portion of the part with the lowest joint reliability is disposed at the greatest distance from the columnar body 27, as shown in FIG. 10.

This kind of regulation of the disposition of the columnar body 27 is carried out so that when the heat generating elements 30b and 30c on the upper side are the power module 53 or the like of the IPM 55, joined with high joint reliability to the heat sink 20 by soldering or the like, and the heat generating element 40b on the lower side is the reactor 64 or the like, fastened with low joint reliability to the heat sink 20 across thermal grease or the like, a joint portion of the heat generating element 40b and the heat sink 20 has the lowest joint reliability, and a heat dissipating order of priority is seen as being lower, and the columnar body 27, which impedes heat dissipation, is disposed away from a region immediately below the heat generating elements 30b and 30c (or the central portion of each heat generating element) so as to prioritize heat dissipation of the heat generating elements 30b and 30c, which have a highly reliable joint with the heat sink 20.

It goes without saying that by all of the heat generating elements 30b, 30c, and 40b being disposed within a refrigerant channel 24 formation range of the heat sink 20, which forms heat dissipating faces, a certain coolability is secured.

In this way, it is sufficient that a disposition of the columnar body 27 in the refrigerant channel 24 is considered in accordance with an electronic part joined to the heat sink 20, taking the reliability of the electronic part into consideration, and the columnar body can be used with various dispositions and forms.

As heretofore described, the vertical fastening portion 28 is formed by a welding such as FSW or electron beam welding. FSW is welding means for joining two metals whereby high joint reliability is obtained, and when using a sealing material of rubber, or a sealing material obtained using a formed-in-place gasket (FIPG), or the like, no measure is needed against resin deterioration occurring in a fastening place or elastic deformation due to vibration, thermal shock, or the like, which is suited to this configuration.

As heretofore described, the channel seal 26 can also be provided using FSW, and there is no need to adopt a double seal structure in order to improve the sealing characteristics of the channel seal 26, or for a drainage channel for discharging leaking water to an exterior of the case when a sealing function defect occurs.

Herein, in addition to welding such as FSW and electron beam welding, there is also a method called brazing as welding means for joining two metals whereby high joint reliability is obtained, but when using the brazing method, a temperature of a joint portion is raised as far as a vicinity of a melting point of a material configuring the heat sink 20, because of which material strength in the joint portion decreases, whereby vibration resistance decreases, or an increase in thickness is needed in order to obtain a rigidity necessary in order to secure vibration resistance. As opposed to this, FSW is such that there is no need to raise the temperature as far as a vicinity of the melting point of the material of the heat sink 20, because of which material strength does not decrease and vibration resistance does not decrease, meaning that no increase in thickness is needed, and there is no accompanying increase in size of the device.

The technology described in the first to third embodiments shows that the electronic part housing structure is used as the vehicle-use power converting device 100, but not being limited to this, it goes without saying that the electronic part housing structure is also applied to other applications. Provided that the electronic part housing structure is the basic structure of the first embodiment of the application, that is, the structure wherein the depressed portion of the heat sink base portion 22 is covered by the heat sink upper plate 23, cooling water is caused to pass through the refrigerant channel 24 formed by a periphery thereof being sealed, and an electronic part forming a heat generating element is mounted on the heat sink upper plate 23, water can be prevented from covering a high voltage electronic part enclosed by the waterproofing wall by using the wall face portion 52*a* of the terminal block 52 forming the waterproofing wall, the sealing member 81, and the waterproofing cave 82. Also, even when a defect occurs in the channel seal 26 of the refrigerant channel 24, and cooling water seeps out into the internal space 30*a* of the upper case 30, water detection can be carried out by utilizing a phenomenon such that when a low voltage electronic part in proximity to the linking hole portion 21, or disposed in the bottom face portion of the internal space 40*a* of the lower case 40, is covered cooling water, an output of the low voltage electronic part changes, and the device can be utilized safely.

The embodiments can be freely combined, and each embodiment can be modified or abbreviated as appropriate.

Various modifications and alterations of this invention will be apparent to those skilled in the art without departing from the scope and spirit of this invention, and it should be understood that this is not limited to the illustrative embodiments set forth herein.

What is claimed is:

1. An electronic part housing structure, comprising:
a heat sink including a heat sink base portion on an upper face side of which a depressed portion forming a refrigerant channel is provided and a heat sink upper plate caused to cover the depressed portion of the heat sink base portion, wherein the refrigerant channel is sealed using a seal portion provided in an outer peripheral portion of the heat sink upper plate;
an upper case caused to cover an upper face side of the heat sink;
an electronic part mounted on an upper face of the heat sink upper plate; and
a waterproofing wall provided between the electronic part and the seal portion in an internal space of the upper case and protruding from the upper face of the heat sink upper plate so as to enclose the electronic part.

2. The electronic part housing structure according to claim 1, wherein the waterproofing wall is of a configuration including a sealing member provided in contact with the upper face of the heat sink upper plate, and a wall face portion provided so as to extend upward from the sealing member.

3. The electronic part housing structure according to claim 2, wherein the wall face portion is provided to a height that does not interfere with an electronic part disposed in an internal space ceiling portion of the upper case, and includes a waterproofing cave protruding outward from an outer face upper portion of the wall face portion.

4. The electronic part housing structure according to claim 3, wherein a conductive wiring portion is provided in an outer face portion of the wall face portion, and the wiring portion is disposed in a position higher than the waterproofing eave.

5. The electronic part housing structure according to claim 1, comprising:
a lower case caused to cover a lower face side of the heat sink; and
a linking hole portion positioned on an outer side of the waterproofing wall, provided penetrating the heat sink base portion in a vertical direction, and linking internal spaces of the upper case and the lower case, wherein
a low voltage electronic part to which is applied a voltage lower than a voltage applied to the electronic part mounted on the upper face of the heat sink upper plate is mounted on an outer side of the waterproofing wall in a position in proximity to the linking hole portion.

6. The electronic part housing structure according to claim 1, comprising:
a lower case caused to cover a lower face side of the heat sink; and
a linking hole portion positioned on an outer side of the waterproofing wall, provided penetrating the heat sink base portion in a vertical direction, and linking internal spaces of the upper case and the lower case, wherein
a low voltage electronic part to which is applied a voltage lower than a voltage applied to the electronic part mounted on the upper face of the heat sink upper plate is mounted on an outer side of the waterproofing wall in a position lower than the linking hole portion.

7. The electronic part housing structure according to claim 6, wherein the low voltage electronic part is disposed in a bottom face portion of the lower case.

8. The electronic part housing structure according to claim 1, wherein the seal portion is disposed so as to singly enclose the outer peripheral portion of the heat sink upper plate.

9. The electronic part housing structure according to claim 8, wherein the seal portion is provided so as to have a width of 3 mm or less.

10. The electronic part housing structure according to claim 1, wherein the heat sink base portion includes a columnar support portion protruding from an internal bottom face of the depressed portion and in contact with a face of the heat sink upper plate forming the refrigerant channel.

11. The electronic part housing structure according to claim 1 applied to a power converting device.

12. The electronic part housing structure according to claim 11, wherein the electronic part disposed in the internal space ceiling portion of the upper case is a smoothing capacitor or a discharge resistor configuring the power converting device.

13. The electronic part housing structure according to claim 12, wherein an electronic part to which is applied a voltage higher than that applied to a low voltage electronic part disposed in an internal space bottom face portion of the lower case caused to cover the lower face side of the heat sink is disposed in a position higher than the internal space bottom face portion of the lower case.

14. The electronic part housing structure according to claim 13, wherein a position higher than the internal space bottom face portion of the lower case corresponds to a depressed portion provided in a lower face of the heat sink base portion forming an internal space ceiling portion of the lower case, or to a stepped portion provided protruding upward from the internal space bottom face portion.

15. The electronic part housing structure according to claim 13, wherein the electronic part disposed in a position higher than the internal space bottom face portion of the lower case is a direct current input terminal, a three-phase output terminal, a reactor, or a step-down converter configuring the power converting device.

16. The electronic part housing structure according to claim 13, wherein the low voltage electronic part disposed in the internal space bottom face portion of the lower case is a control substrate or a control signal connector.

* * * * *